(12) United States Patent
Iso et al.

(10) Patent No.: US 8,679,254 B2
(45) Date of Patent: Mar. 25, 2014

(54) VAPOR PHASE EPITAXY APPARATUS OF GROUP III NITRIDE SEMICONDUCTOR

(75) Inventors: Kenji Iso, Kanagawa (JP); Yoshiyasu Ishihama, Kanagawa (JP); Ryohei Takaki, Kanagawa (JP); Yuzuru Takahashi, Kanagawa (JP)

(73) Assignee: Japan Pionics Co., Ltd., Hiratsuka-Shi, Kanagawa (JP)

( * ) Notice: Subject to any disclaimer, the term of this patent is extended or adjusted under 35 U.S.C. 154(b) by 604 days.

(21) Appl. No.: 13/014,199

(22) Filed: Jan. 26, 2011

(65) Prior Publication Data
US 2011/0180001 A1    Jul. 28, 2011

(30) Foreign Application Priority Data

Jan. 26, 2010 (JP) ................................ 2010-014166

(51) Int. Cl.
| | | |
|---|---|---|
| *C23C 16/455* | (2006.01) | |
| *C23C 16/46* | (2006.01) | |
| *C23C 16/458* | (2006.01) | |
| *H01L 21/306* | (2006.01) | |
| *C23F 1/00* | (2006.01) | |
| *C23C 16/06* | (2006.01) | |
| *C23C 16/22* | (2006.01) | |

(52) U.S. Cl.
USPC ...... 118/715; 118/724; 118/725; 156/345.51; 156/345.52; 156/345.53; 156/345.33; 156/345.34

(58) Field of Classification Search
USPC ........ 118/724, 725, 715; 156/345.51, 345.52, 156/345.53, 345.33, 345.34
See application file for complete search history.

(56) References Cited

U.S. PATENT DOCUMENTS

| 5,027,746 A | * | 7/1991 | Frijlink | 118/724 |
| 5,782,979 A | * | 7/1998 | Kaneno et al. | 118/500 |
| 6,080,642 A | * | 6/2000 | Van Geelen et al. | 438/478 |

(Continued)

FOREIGN PATENT DOCUMENTS

| JP | 59111997 A | * | 6/1984 | C30B 25/10 |
| JP | 62053773 A | * | 3/1987 | B05C 11/08 |

(Continued)

*Primary Examiner* — Rudy Zervigon
(74) *Attorney, Agent, or Firm* — Antonelli, Terry, Stout & Krauss, LLP.

(57) ABSTRACT

[Problem] Provided is a vapor phase epitaxy apparatus of a group III nitride semiconductor including: a susceptor for holding a substrate; the opposite face of the susceptor; a heater for heating the substrate; a reactor formed of a gap between the susceptor and the opposite face of the susceptor; a raw material gas-introducing portion for supplying a raw material gases from the central portion of the reactor toward the peripheral portion of the reactor; and a reacted gas-discharging portion. Even when crystal growth is conducted on the surfaces of a large number of large-aperture substrates, the vapor phase epitaxy apparatus can eject each raw material gas at an equal flow rate for any angle, and can suppress the decomposition and crystallization of the raw material gases on the opposite face of the susceptor.

[Solving Means] The vapor phase epitaxy apparatus is such that: the opposite face of the susceptor has means for flowing a coolant therein; the raw material gas-introducing portion has a plurality of gas ejection orifices formed of such a constitution that the gas ejection orifices are partitioned in a vertical direction with a disk-like partition; and at least one of the gas ejection orifices has such a constitution that the gas ejection orifice is partitioned in a circumferential direction with a plurality of columnar partitions.

7 Claims, 4 Drawing Sheets

(56) References Cited

U.S. PATENT DOCUMENTS

| | | | |
|---|---|---|---|
| 6,786,973 B2 * | 9/2004 | Strauch et al. | 118/715 |
| 7,067,012 B2 * | 6/2006 | Jurgensen et al. | 118/730 |
| 7,128,785 B2 * | 10/2006 | Kaeppeler et al. | 117/90 |
| 7,147,718 B2 * | 12/2006 | Jurgensen et al. | 118/715 |
| 7,294,207 B2 * | 11/2007 | Strauch et al. | 118/715 |
| 8,152,924 B2 * | 4/2012 | Dauelsberg et al. | 118/715 |
| 8,277,893 B2 * | 10/2012 | Ohori et al. | 427/255.394 |
| 2003/0177977 A1 * | 9/2003 | Strauch et al. | 117/84 |
| 2003/0180460 A1 * | 9/2003 | Strauch et al. | 427/248.1 |
| 2003/0221624 A1 * | 12/2003 | Jurgensen et al. | 118/725 |
| 2004/0003779 A1 * | 1/2004 | Jurgensen et al. | 118/723 I |
| 2004/0005731 A1 * | 1/2004 | Jurgensen et al. | 438/100 |
| 2004/0129215 A1 * | 7/2004 | Kaeppeler et al. | 118/715 |
| 2004/0182310 A1 * | 9/2004 | Kaeppeler | 117/200 |
| 2004/0231599 A1 * | 11/2004 | Schwambera et al. | 118/728 |
| 2005/0000441 A1 * | 1/2005 | Kaeppeler et al. | 118/723 E |
| 2005/0011435 A1 * | 1/2005 | Dauelsberg | 117/92 |
| 2006/0112881 A1 * | 6/2006 | Kaeppeler | 118/715 |
| 2006/0201427 A1 * | 9/2006 | Jurgensen et al. | 118/715 |
| 2007/0051316 A1 * | 3/2007 | Ohori et al. | 118/725 |
| 2008/0308040 A1 * | 12/2008 | Dauelsberg et al. | 118/715 |
| 2009/0064935 A1 * | 3/2009 | Dauelsberg et al. | 118/724 |
| 2009/0269938 A1 * | 10/2009 | Ohori et al. | 438/758 |
| 2010/0037827 A1 * | 2/2010 | Kaeppeler | 118/725 |
| 2010/0273320 A1 * | 10/2010 | Kappeler et al. | 438/507 |
| 2010/0307418 A1 * | 12/2010 | Iso et al. | 118/725 |
| 2011/0180001 A1 * | 7/2011 | Iso et al. | 118/725 |
| 2012/0204796 A1 * | 8/2012 | Witt et al. | 118/725 |

FOREIGN PATENT DOCUMENTS

| | | | | |
|---|---|---|---|---|
| JP | 62054081 A * | 3/1987 | | C23C 16/46 |
| JP | 04026592 A * | 1/1992 | | C30B 25/14 |
| JP | 05021359 A * | 1/1993 | | H01L 21/205 |
| JP | 07169698 A * | 7/1995 | | H01L 21/205 |
| JP | 08215971 A * | 8/1996 | | B23Q 7/02 |
| JP | 2002-175992 | 6/2002 | | |
| JP | 2002-246323 | 8/2002 | | |
| JP | 2006-253244 | 9/2006 | | |
| JP | 2007-96280 | 4/2007 | | |
| JP | 2007-243060 | 9/2007 | | |
| JP | 2008071875 A * | 3/2008 | | |

* cited by examiner

VAPOR PHASE EPITAXY APPARATUS OF GROUP III NITRIDE SEMICONDUCTOR

TECHNICAL FIELD

The present invention relates to a vapor phase epitaxy apparatus (MOCVD apparatus) for a group III nitride semiconductor, and more specifically, to a vapor phase epitaxy apparatus for a group III nitride semiconductor including a susceptor for holding a substrate, a heater for heating the substrate, a raw material gas-introducing portion, a reactor, and a reacted gas-discharging portion.

BACKGROUND ART

A metal organic chemical vapor deposition method (MOCVD method) has been employed for the crystal growth of a nitride semiconductor as frequently as a molecular beam epitaxy method (MBE method). In particular, the MOCVD method has been widely employed in apparatuses for the mass production of compound semiconductors in the industrial community because the method provides a higher crystal growth rate than the MBE method does and obviates the need for a high-vacuum apparatus or the like unlike the MBE method. In recent years, in association with widespread use of blue or ultraviolet LEDs and of blue or ultraviolet laser diodes, numerous researches have been conducted on increases in apertures and number of substrates each serving as an object of the MOCVD method in order that the mass productivity of gallium nitride, gallium indium nitride, and gallium aluminum nitride may be improved.

Such vapor phase epitaxy apparatuses are, for example, vapor phase epitaxy apparatuses each having a susceptor for holding a substrate, an opposite face of the susceptor, a heater for heating the substrate, a reactor formed of a gap between the susceptor and the opposite face of the susceptor, a raw material gas-introducing portion for supplying a raw material gas from the central portion of the reactor toward the peripheral portion of the reactor, and a reacted gas-discharging portion as described in Patent Documents 1 to 4. Each of those vapor phase epitaxy apparatuses is of such a constitution that a plurality of substrate holders are provided for the susceptor and the substrate holders each rotate and revolve in association with the rotation of the susceptor by driving means. Further, two kinds of forms, i.e., a form in which a crystal growth surface is directed upward (face-up type) and a form in which a crystal growth surface is directed downward (face-down type) have been mainly proposed as a form of a vapor phase epitaxy apparatus.

[Patent Document 1] JP 2002-175992 A
[Patent Document 2] JP 2006-253244 A
[Patent Document 3] JP 2007-96280 A
[Patent Document 4] JP 2007-243060 A
[Patent Document 5] JP 2002-246323 A

DISCLOSURE OF THE INVENTION

Problem to be Solved by the Invention

However, even such vapor phase epitaxy apparatus involves a large number of problems that still remain unsolved. For example, when vapor phase epitaxy is performed by ejecting the raw material gases from the central portion of the reactor toward the peripheral portion of the reactor, a plurality of substrates revolve on a circumference around the central portion of the susceptor so that a difference in thickness resulting from the positions of the substrates may be reduced. However, crystal growth is desirably performed at a reaction rate that is kept constant at all times. To that end, each of the raw material gases is requested to be ejected from the central portion at an equal flow rate for any angle. In addition, the various raw material gases decompose on the surfaces of the substrates heated to high temperatures to crystallize. However, the opposite face of each substrate (the susceptor) is also heated by the heater, and the raw material gases each undergo a reaction on the surface of the opposite face to adversely affect crystal growth on the substrates. Accordingly, the decomposition of the raw material gases on the surface of the opposite face is requested to be suppressed.

However, in association with increases in apertures and number of substrates, a lengthened raw material gas channel in the reactor makes it additionally difficult for each raw material gas ejected from the central portion to pervade a downstream side at an equal flow rate efficiently. In addition, even when an inert gas is introduced from an ejection orifice closest to the opposite face of the susceptor, heated raw material gases are each apt to contact the opposite face of a substrate (the susceptor) on the downstream side in the reactor, and the raw material gases decompose on the surface of the opposite face to crystallize. As growth is repeated, a crystal gradually deposits, and hence it also becomes difficult to obtain a high-quality crystalline film on each substrate with good reproducibility.

Therefore, a problem to be solved by the present invention is to provide such a vapor phase epitaxy apparatus that supplies raw material gases from the central portion of a reactor toward the peripheral portion of the reactor as described above. Even when crystal growth is conducted on the surfaces of a large number of large-aperture substrates held by a susceptor having a large diameter, the vapor phase epitaxy apparatus can eject each of the raw material gases from the central portion of the reactor toward the peripheral portion of the reactor at an equal flow rate for any angle, and can suppress the decomposition and crystallization of each of the raw material gases on, for example, the opposite face of each substrate (the susceptor).

Means for Solving the Problems

The inventors of the present invention have made extensive studies to solve such problem. As a result, the inventors have found, for example, the following. When the opposite face of the susceptor in such vapor phase epitaxy apparatus as described above is constituted so that the opposite face can be cooled, the raw material gas-introducing portion has a plurality of gas ejection orifices partitioned in a vertical direction with a disk-like partition, and at least one of the ejection orifices is constituted so as to be partitioned in a circumferential direction with a plurality of columnar partitions, raw material gases are each easily ejected at an equal flow rate for any angle, and the columnar partitions are cooled from a cooling portion on the opposite face of the susceptor to suppress an increase in temperature of each raw material gas. Thus, the inventors have reached a vapor phase epitaxy apparatus of a group III nitride semiconductor of the present invention.

That is, the present invention is a vapor phase epitaxy apparatus of a group III nitride semiconductor, including: a susceptor for a holding substrate; an opposite face of the susceptor; a heater for heating the substrate; a reactor formed of a gap between the susceptor and the opposite face of the susceptor; a raw material gas-introducing portion for supplying a raw material gas from the central portion of the reactor toward the peripheral portion of the reactor; and a reacted gas-discharging portion, in which: the opposite face of the susceptor has means for flowing a coolant therein; the raw material gas-introducing portion has a plurality of gas ejection orifices formed of such a constitution that the gas ejection orifices are partitioned in a vertical direction with a disk-like partition; and at least one of the gas ejection orifices has such a constitution that the gas ejection orifice is partitioned in a circumferential direction with a plurality of columnar partitions.

Effects of the Invention

The vapor phase epitaxy apparatus of the present invention has the plurality of gas ejection orifices formed of such a constitution that the gas ejection orifices are partitioned in a vertical direction with a disk-like partition, and at least one of the gas ejection orifices has such a constitution that the gas ejection orifice is partitioned in a circumferential direction with a plurality of columnar partitions. Accordingly, a moderate pressure loss occurs at the columnar partitions in a gas channel, and a gas to be ejected from the central portion is easily ejected at an equal flow rate with homogeneous gas composition for any angle. In addition, the tip of the gas ejection orifice is easily cooled by heat transfer from the cooling means provided in the opposite face of the susceptor by virtue of the columnar partitions, and hence an increase in temperature of each raw material gas can be suppressed. As a result of those actions, the reaction efficiency of each of the raw material gases on the substrates is improved, the decomposition and crystallization of the raw material gases on the surface of the opposite face of the susceptor are suppressed, and a high-quality crystalline film can be obtained on the surface of each of the substrates with good reproducibility.

Figure 1:
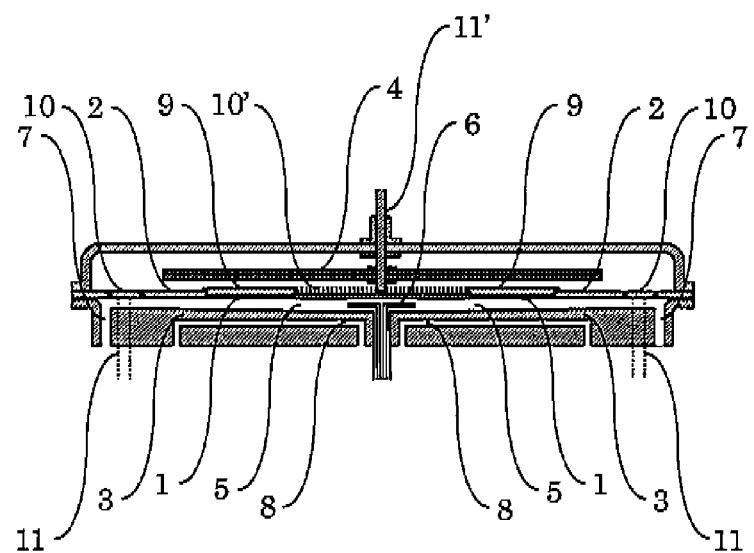
FIG. 1 is a vertical sectional view illustrating an example of a vapor phase epitaxy apparatus of the present invention.

DESCRIPTION OF SYMBOLS 1 substrate
2 susceptor
3 member facing the susceptor
4 heater
5 reactor
6 raw material gas-introducing portion
7 reacted gas-discharging portion
8 means for flowing coolant
9 soaking plate
10 means for transferring rotation
10' means for transferring rotation
11 rotating shaft for rotating susceptor
11' rotating shaft for rotating substrate
12 disk-like partition
12' disk-like partition
12" disk-like partition
13 gas ejection orifice
14 columnar partition
15 gas channel
16 gas channel
17 gas channel
18 claw

BEST MODE FOR CARRYING OUT THE INVENTION

The present invention is applied to a vapor phase epitaxy apparatus for a group III nitride semiconductor having a susceptor for holding a substrate, an opposite face of the susceptor, a heater for heating the substrate, a reactor formed of a gap between the susceptor and the opposite face of the susceptor, a raw material gas-introducing portion for supplying the reactor with a raw material gas, and a reacted gas-discharging portion. The vapor phase epitaxy apparatus of the present invention is a vapor phase epitaxy apparatus for performing the crystal growth of a nitride semiconductor mainly formed of a compound of one kind or two or more kinds of metals selected from gallium, indium, and aluminum, and nitrogen. In the present invention, an effect can be sufficiently exerted particularly in the case of such vapor phase epitaxy that a plurality of substrates of such sizes as to have diameters of 3 inches or more are held.

Hereinafter, the vapor phase epitaxy apparatus of the present invention is described in detail with reference to FIGS. 1 to 8. However, the present invention is not limited by the figures.

Figure 2:
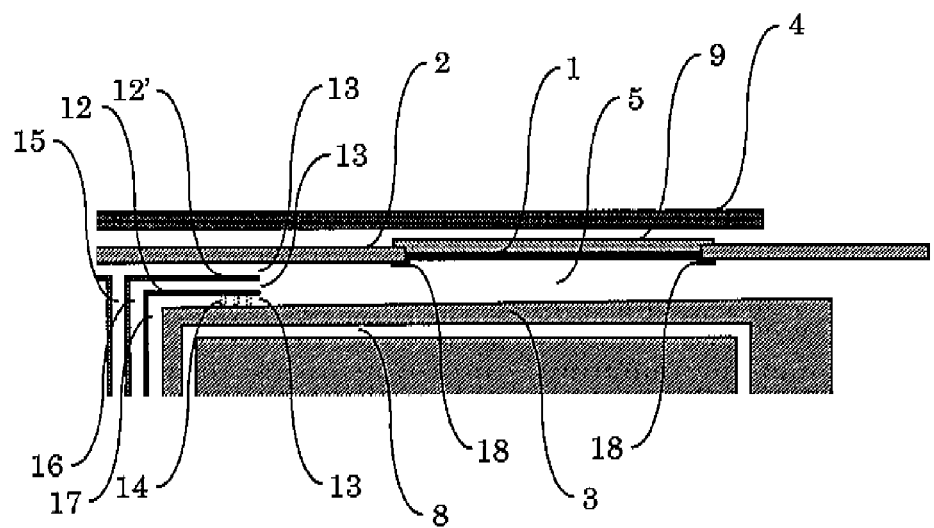
FIG. 2 is an enlarged vertical sectional view illustrating an example of the vicinity of the raw material gas-introducing portion of the vapor phase epitaxy apparatus of the present invention.
Figure 3:
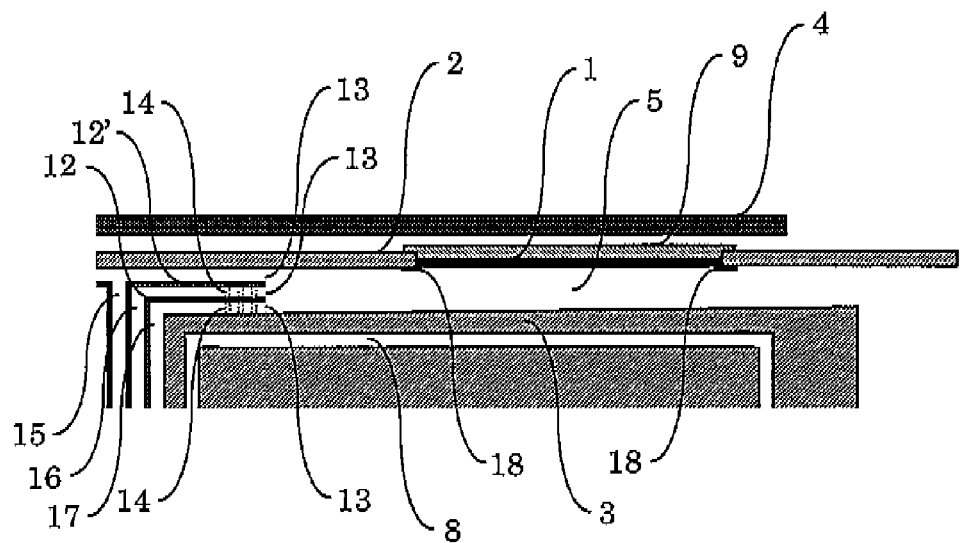
FIG. 3 is an enlarged vertical sectional view illustrating an example except FIG. 2 of the vicinity of the raw material gas-introducing portion of the vapor phase epitaxy apparatus of the present invention.
Figure 8:
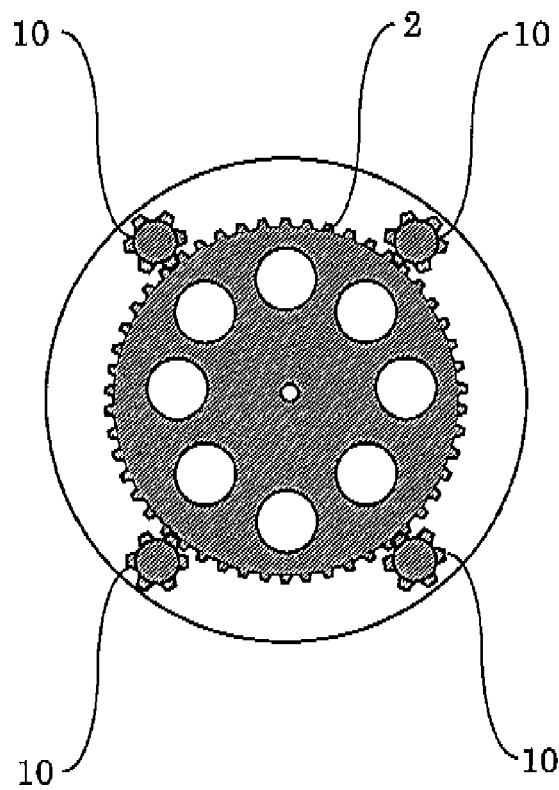
FIG. 8 is a plan constitution view illustrating an example of the form of a susceptor in the vapor phase epitaxy apparatus of the present invention.

It should be noted that FIG. 1 is a vertical sectional view illustrating an example of the vapor phase epitaxy apparatus of the present invention. (The vapor phase epitaxy apparatus of FIG. 1 is a vapor phase epitaxy apparatus including such a mechanism that a susceptor 2 is rotated by the rotation of a rotating shaft 11 and means 10 for transferring the rotation (such as disks each having teeth on its outer periphery), and substrates 1 are rotated by the rotation of a rotating shaft 11' and means 10' for transferring the rotation.) FIGS. 2 and 3 are each an enlarged vertical sectional view illustrating an example of the vicinity of the raw material gas-introducing portion of the vapor phase epitaxy apparatus of the present invention. FIGS. 4 to 7 are each a plan constitution view illustrating an example of the arrangement of a disk-like partition and columnar partitions in the raw material gas-introducing portion of the vapor phase epitaxy apparatus of the present invention. FIG. 8 is a plan constitution view illustrating an example of the form of the susceptor in the vapor phase epitaxy apparatus of the present invention.

As illustrated in FIG. 1, the vapor phase epitaxy apparatus of a group III nitride semiconductor of the present invention is a vapor phase epitaxy apparatus of a group III nitride semiconductor including: the susceptor 2 for holding the substrates 1; member 3 facing the susceptor (referred to hereinafter as the opposite face 3 of the susceptor); a heater 4 for heating the substrate; a reactor 5 formed of a gap between the susceptor and the opposite face of the susceptor; a raw material gas-introducing portion 6 for supplying a raw material gases from the central portion of the reactor toward the peripheral portion of the reactor; and a reacted gas-discharging portion 7. In the vapor phase epitaxy apparatus of a group III nitride semiconductor, the opposite face of the susceptor has means 8 for flowing a coolant therein, the raw material gas-introducing portion has a plurality of gas ejection orifices 13 formed of such a constitution that the gas ejection orifices are partitioned in a vertical direction with a disk-like partition 12 (12' or 12") as illustrated in each of the vertical sectional views of FIGS. 2 and 3, and at least one of the gas ejection orifices has such a constitution that the gas ejection orifice is partitioned in a circumferential direction with a plurality of columnar partitions 14.

In the present invention, a tube is typically placed in the opposite face of the susceptor (or the constituent of the opposite face) as the means 8 for flowing the coolant. The number of tubes may be one, or may be two or more. In addition, the constitution of the tube is not particularly limited, and examples of the constitution include: such a constitution that a plurality of tubes are radially placed from the central portion of the opposite face of the susceptor (or the constituent of the opposite face); and such a constitution that the tubes are spirally placed from the central portion. The direction in which the coolant flows is not particularly limited. An arbitrary high-boiling point solvent is used as the coolant to be flowed in the tube, and a solvent having a boiling point of 90° C. or more is particularly preferred. Examples of such coolant include water, an organic solvent, and oil. In the present invention, flowing the coolant upon vapor phase epitaxy can cool not only the opposite face 3 of the susceptor but also the tip portion of each of the gas ejection orifices 13 (in particular, the tip portion of an ejection orifice close to the opposite face of the susceptor) through the columnar partitions 14 to be described later to suppress the decomposition and crystallization of the raw material gases on the opposite face of the susceptor.

Next, the disk-like partition and the columnar partitions in the raw material gas-introducing portion are described in detail. The disk-like partition 12 (12' or 12") and the columnar partitions 14 are of such a constitution as illustrated in each of FIGS. 2 and 3 in a vertical surface, and are of such a constitution as illustrated in each of FIGS. 4 to 7 in a horizontal surface. It should be noted that the disk-like partition 12" is such that the columnar partitions 14 are removed from the disk-like partition 12' illustrated in each of FIGS. 6 and 7. Two or more of the columnar partitions 14 are placed on the circumference of each of a plurality of concentric circles on the upper surface or lower surface of the disk-like partition 12 (12'), and the columnar partitions placed on the same circumference are placed at an equal interval. In addition, the columnar partitions 14 are of such a constitution as to be interposed between the disk-like partition 12 and the opposite face 3 of the susceptor, such a constitution as to be interposed between the disk-like partition 12 and the disk-like partition 12', or such a constitution as to be interposed between the disk-like partition 12' and the susceptor 2.

In the present invention, the number of disk-like partitions to be provided is typically 1 to 3. For example, when the number of disk-like partitions is two, as illustrated in each of FIGS. 4 and 5, the central portion of the disk-like partition 12 is provided with a hole for passing a gas that flows from a gas channel 15 and a gas that flows from a gas channel 16, and as illustrated in each of FIGS. 6 and 7, the central portion of the disk-like partition 12' is provided with a hole 15 for passing the gas that flows from the gas channel 15. It should be noted that the form of such hole for flowing a gas is appropriately set depending on, for example, the number of disk-like partitions. In addition, the hole for flowing a gas of each disk-like partition is not limited to a double tube or triple tube, and can be, for example, parallel tubes.

In the present invention, the columnar partitions 14 are typically cylinders, and are provided so as to contact the disk-like partition 12 (12'), the opposite face 3 of the susceptor, or the susceptor 2. In addition, 4 to 1,000 of the columnar partitions 14 are provided on the circumference of each of typically 1 to 50, preferably 2 to 40, concentric circles. Various gases supplied from the gas channel 15, the gas channel 16, and a gas channel 17 are each supplied from the hole at the central portion of the disk-like partition 12 (12'), pass gaps between the columnar partitions 14, and are then ejected from the gas ejection orifices 13 toward the peripheral portion of the reactor. It should be noted that, when the raw material gas-introducing portion is constituted as illustrated in each of FIGS. 2 and 3, a gas containing ammonia is supplied to the gas channel 15, a gas containing an organometallic compound is supplied to the gas channel 16, and a carrier gas is supplied to the gas channel 17 in ordinary cases.

The disk-like partition typically has a diameter of 2 to 50 cm and a thickness of 0.1 to 3 mm, and each of the columnar partitions is typically a cylinder having a horizontal sectional diameter of 0.5 to 100 mm and a height of 0.2 to 10 mm or a polygonal column having a horizontal sectional area of 0.2 to 8,000 $mm^2$ and a height of 0.2 to 10 mm. Although the columnar partitions 14 are preferably provided for the peripheral portion of the disk-like partition 12 (12') as illustrated in each of FIGS. 4 and 6, the columnar partitions can be provided near the central portion of the disk-like partition 12 (12') as illustrated in each of FIGS. 5 and 7.

In addition, the disk-like partition and the columnar partitions are typically constituted of one or more kinds of materials selected from metals, alloys, metal oxides, ceramics, and carbon-based materials (such as carbon, pyrolytic graphite (PG), and glassy carbon (GC)).

In addition, a ratio of the total area occupied by all columnar partitions on the disk-like partition to the area of the disk-like partition (excluding the gas channels) is preferably 20 to 80%.

The form of the susceptor in the present invention is, for example, a disk shape having spaces for holding a plurality of substrates in its peripheral portion as illustrated in FIG. 8. Such vapor phase epitaxy apparatus as illustrated in FIG. 1 is of the following constitution. That is, for example, disks each having teeth on its outer periphery as the rotation-transferring means 10 are installed so as to engage with teeth on the outer periphery of the susceptor, and the disks are rotated through external rotation-generating portions and the rotating shaft 11 so that the susceptor 2 may rotate. Such susceptor is caused to hold the substrates 1 that rotate by the rotation-transferring means 10' (such as disks each having teeth on its outer periphery) rotated through external rotation-generating portions and the rotating shaft 11' together with soaking plates 9 with claws 18, and is set in the vapor phase epitaxy apparatus so that the crystal growth surfaces of the substrates may be directed, for example, downward.

Upon performance of crystal growth on the substrate with the vapor phase epitaxy apparatus of the present invention, the organometallic compound (such as trimethyl gallium, triethyl gallium, trimethyl indium, triethyl indium, trimethyl aluminum, or triethyl aluminum) and ammonia serving as the raw material gases, and the carrier gas (hydrogen or an inert gas such as nitrogen, or a mixed gas thereof) are supplied by the respective external tubes to the raw material gas-introducing portion of such vapor phase epitaxy apparatus of the present invention as described above. Further, the gases are each supplied from the raw material gas-introducing portion to the reactor under substantially optimum flow rate and concentration conditions.

EXAMPLES

Next, the present invention is described specifically by way of examples. However, the present invention is not limited by these examples.

Example 1

Production of Vapor Phase Epitaxy Apparatus

Such a vapor phase epitaxy apparatus as illustrated in FIG. 1 was produced by providing, in a reaction vessel made of stainless steel, a disk-like susceptor (made of SiC-coated carbon, having a diameter of 600 mm and a thickness of 20 mm, and capable of holding five 3-inch substrates), the opposite face (made of carbon) of the susceptor provided with a constitution for flowing a coolant, a heater, a raw material gas-introducing portion (made of carbon) for supplying a raw material gas from the central portion of the reactor formed of a gap between the susceptor and the opposite face of the susceptor toward the peripheral portion of the reactor, a reacted gas-discharging portion, and the like. In addition, five substrates each formed of 3 inch-size sapphire (C surface) were set in the vapor phase epitaxy apparatus. It should be noted that one tube was spirally placed in the opposite face of the susceptor from the central portion of the opposite face toward the peripheral portion of the opposite face so as to serve as the constitution for flowing the coolant.

Figure 4:
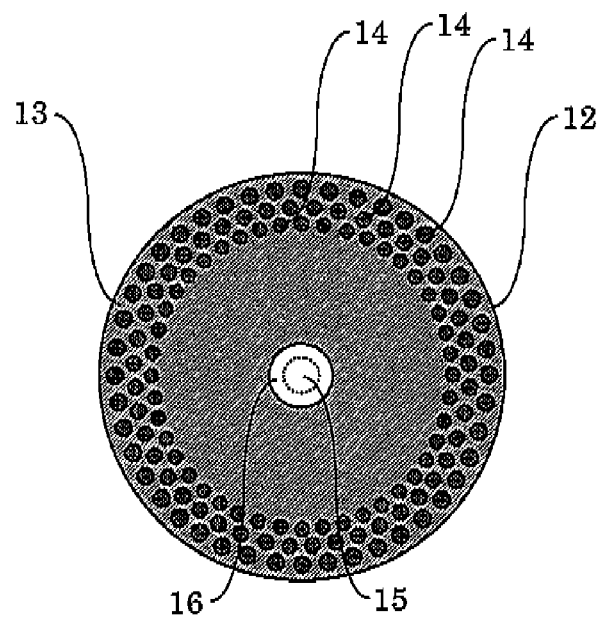
FIG. 4 is a plan constitution view illustrating an example of the arrangement of the disk-like partition and columnar partitions of the vapor phase epitaxy apparatus of the present invention.

Three gas ejection orifices partitioned in a vertical direction with two disk-like partitions (made of carbon) each having a diameter of 200 mm and a thickness of 2 mm were formed in the raw material gas-introducing portion. Further, the ejection orifice closest to the opposite face of the susceptor was partitioned in a circumferential direction with a plurality of cylindrical partitions (made of carbon) each having a horizontal sectional diameter of 8 mm and a height of 3 mm so that such constitution as illustrated in FIG. 2 was obtained. The plurality of cylindrical partitions were provided with such constitution as illustrated in FIG. 4 by: placing 44 cylindrical partitions on the circumference of each of three concentric circles; and placing the columnar partitions placed on the same circumference at an equal interval.

In addition, a horizontal distance between the tip of each of the gas ejection orifices and each of the substrates was 32.4 mm. Further, a tube was connected to each gas channel of the raw material gas-introducing portion through, for example, a massflow controller outside the vapor phase epitaxy apparatus so that each gas was able to be supplied at a desired flow rate and a desired concentration.

(Vapor Phase Epitaxy Experiment)

Gallium nitride (GaN) was grown on the surfaces of the substrates with such vapor phase epitaxy apparatus. After the circulation of cooling water through the flow channel for flowing a coolant of the opposite face (flow rate: 18 L/min) had been initiated, each substrate was cleaned by increasing the temperature of the substrate to 1,050° C. while flowing hydrogen. Subsequently, the temperature of each sapphire substrate was decreased to 510° C., and then a buffer layer formed of GaN was grown so as to have a thickness of about 20 nm on the substrate by using trimethyl gallium (TMG) and ammonia as raw material gases, and hydrogen as a carrier gas.

After the growth of the buffer layer, the supply of only TMG was stopped and the temperature was increased to 1,050° C. After that, ammonia (flow rate: 30 L/min) and hydrogen (flow rate: 1 L/min) were supplied from the ejection orifice in an upper layer, TMG (flow rate: 60 cc/min), ammonia (flow rate: 10 L/min), and hydrogen (flow rate: 30 L/min) were supplied from the ejection orifice in a middle layer, and nitrogen (flow rate: 30 L/min) was supplied from the ejection orifice in a lower layer so that undoped GaN was grown for 1 hour. It should be noted that all growth including that of the buffer layer was performed while each substrate was caused to rotate at a rate of 10 rpm.

After the nitride semiconductor had been grown as described above, the temperature was decreased, and then the substrates were taken out of the reaction vessel. After that, the thicknesses of the GaN films obtained by the vapor phase epitaxy on the substrates were measured. As a result, the average of GaN central film thicknesses on the five substrates was 3.5 µm, and a thickness distribution (±(maximum-minimum)/(average×2)) was ±2.0%.

Example 2

Production of Vapor Phase Epitaxy Apparatus

A vapor phase epitaxy apparatus was produced in the same manner as in Example 1 except that the disk-like partitions and cylindrical partitions of the raw material gas-introducing portion were changed to such constitution as illustrated in FIG. 3 in the production of the vapor phase epitaxy apparatus of Example 1.

The raw material gas-introducing portion was of such a constitution that three gas ejection orifices partitioned in a vertical direction with two disk-like partitions each having a diameter of 240 mm and a thickness of 2 mm were formed, and further, two ejection orifices were partitioned in a circumferential direction with a plurality of cylindrical partitions (made of carbon) each having a horizontal sectional diameter of 10 mm and a height of 3 mm. The plurality of cylindrical partitions were, as illustrated in FIG. 4, such that 32 cylindrical partitions were placed on the circumference of each of three concentric circles and the columnar partitions placed on the same circumference were placed at an equal interval.

(Vapor Phase Epitaxy Experiment)

Gallium nitride (GaN) was grown on the surfaces of substrates with such vapor phase epitaxy apparatus in the same manner as in Example 1.

After the nitride semiconductor had been grown, the temperature was lowered, and the substrates were taken out of the reaction vessel. Then, the thicknesses of the GaN films obtained by the vapor phase epitaxy on the substrates were measured. As a result, the average of GaN central film thicknesses on the five substrates was 3.8 µm, and a thickness distribution was ±1.8%.

Example 3

Production of Vapor Phase Epitaxy Apparatus

Figure 5:
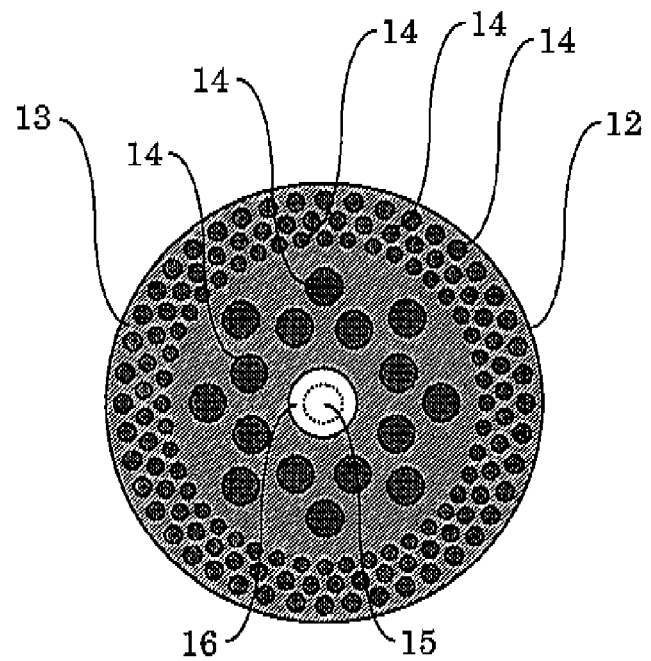
FIG. 5 is a plan constitution view illustrating an example except FIG. 4 of the arrangement of the disk-like partition and columnar partitions of the vapor phase epitaxy apparatus of the present invention.
Figure 6:
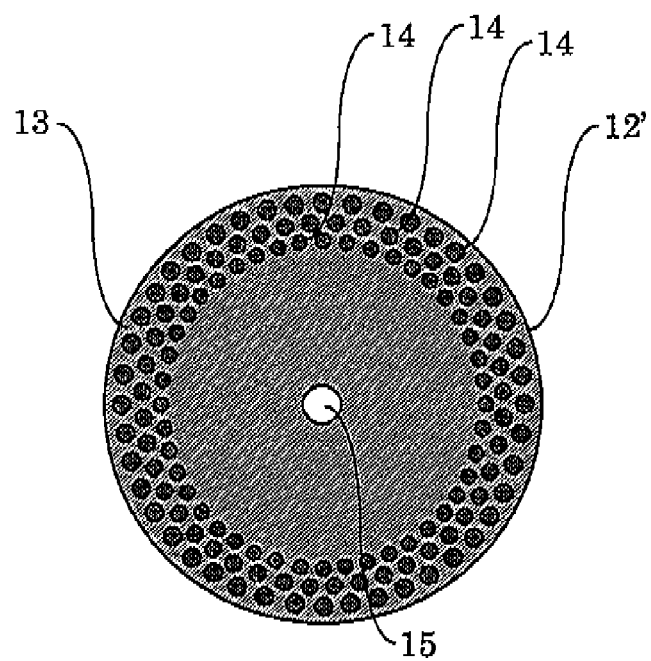
FIG. 6 is a plan constitution view illustrating an example except FIGS. 4 and 5 of the arrangement of the disk-like partition and columnar partitions of the vapor phase epitaxy apparatus of the present invention.
Figure 7:
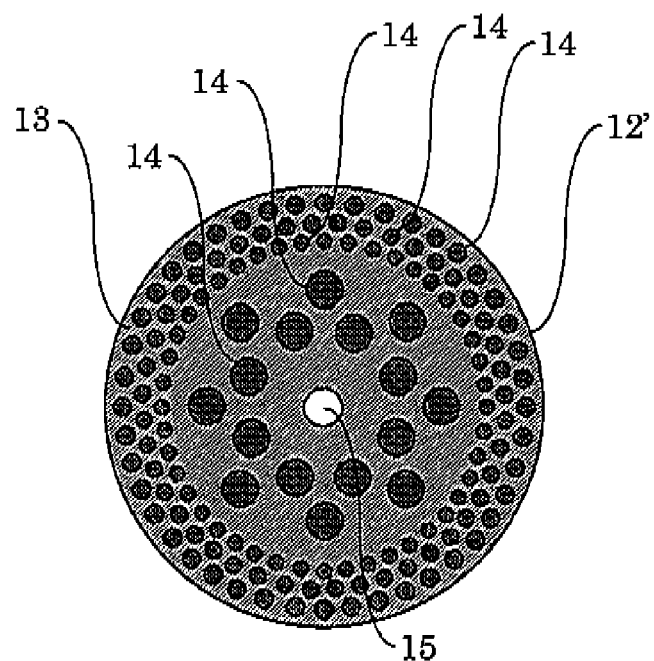
FIG. 7 is a plan constitution view illustrating an example except FIGS. 4 to 6 of the arrangement of the disk-like partition and columnar partitions of the vapor phase epitaxy apparatus of the present invention.

A vapor phase epitaxy apparatus was produced in the same manner as in Example 1 except that the arrangement of the cylindrical partitions in the ejection orifice closest to the opposite face of the susceptor was changed to such constitution as illustrated in FIG. 5 in the production of the vapor phase epitaxy apparatus of Example 1.

The ejection orifice closest to the opposite face of the susceptor was provided with such constitution as illustrated in FIG. 5 by placing eight cylindrical partitions each having a diameter of 25 mm and a height of 3 mm on the circumference of each of two concentric circles near the central portion of the ejection orifice as well as the cylindrical partitions in the peripheral portion of the ejection orifice.

(Vapor Phase Epitaxy Experiment)

Gallium nitride (GaN) was grown on the surfaces of substrates with such vapor phase epitaxy apparatus in the same manner as in Example 1.

After the nitride semiconductor had been grown, the temperature was lowered, and the substrates were taken out of the reaction vessel. Then, the thicknesses of the GaN films obtained by the vapor phase epitaxy on the substrates were measured. As a result, the average of GaN central film thicknesses on the five substrates was 4.3 µm, and a thickness distribution was ±0.8%.

Comparative Example 1

A vapor phase epitaxy apparatus was produced in the same manner as in Example 1 except that no cylindrical partitions were provided for the raw material gas-introducing portion in the production of the vapor phase epitaxy apparatus of Example 1.

Gallium nitride (GaN) was grown on the surfaces of substrates with such vapor phase epitaxy apparatus in the same manner as in Example 1.

After the nitride semiconductor had been grown, the temperature was lowered, and the substrates were taken out of the reaction vessel. Then, the thicknesses of the GaN films obtained by the vapor phase epitaxy on the substrates were measured. As a result, the average of GaN central film thicknesses on the five substrates was 2.4 µm, and a thickness distribution was ±7.2%.

It should be noted that the vapor phase epitaxy experiment of each of Examples 1 to 3 and Comparative Example 1 was repeated five times and the contaminated state of the surface of the opposite face of the susceptor was observed. As a result, the surface of the opposite face of the susceptor in each of Examples 1 to 3 was clearly contaminated to a smaller extent than that in Comparative Example 1, and hence the fact that the suppression of the decomposition and crystallization of the raw material gases was attained was confirmed.

As described above, the vapor phase epitaxy apparatus of the present invention can eject a gas to be ejected from a central portion at a nearly equal flow rate for any angle, and can suppress the decomposition and crystallization of a raw material gas on the opposite face of the susceptor.

The invention claimed is:

1. A vapor phase epitaxy apparatus of a group III nitride semiconductor, comprising:
   a susceptor for holding a substrate;
   a member facing the susceptor;
   a heater for heating the substrate;
   a reactor formed of a gap between the susceptor and the opposite face of the susceptor;
   a raw material gas-introducing portion for supplying a raw material gases from a central portion of the reactor toward a peripheral portion of the reactor; and
   a reacted gas-discharging portion,
   wherein:
   the member facing the susceptor has means for flowing a coolant therein;
   the raw material gas-introducing portion has a plurality of gas ejection orifices formed of such a constitution that the gas ejection orifices are partitioned in a vertical direction with a disk-like partition; and
   at least one of the gas ejection orifices has such a constitution that the gas ejection orifice is partitioned in a circumferential direction with a plurality of columnar partitions.

2. A vapor phase epitaxy apparatus of a group III nitride semiconductor according to claim 1, wherein the columnar partitions are provided at least for an ejection orifice closest to the member facing the susceptor.

3. The vapor phase epitaxy apparatus of a group III nitride semiconductor according to claim 1, wherein:
   two or more of the columnar partitions are placed on a circumference of each of a plurality of concentric circles; and
   the columnar partitions placed on the same circumference are placed at an equal interval.

4. The vapor phase epitaxy apparatus of a group III nitride semiconductor according to claim 1, wherein the disk-like partition and the columnar partitions are formed of one or more kinds of materials selected from metals, alloys, metal oxides, ceramics, and carbon-based materials.

5. The vapor phase epitaxy apparatus of a group III nitride semiconductor according to claim 1, wherein the raw material gas-introducing portion includes an ejection orifice for a gas containing ammonia, an ejection orifice for a gas containing an organometallic compound, and an ejection orifice for a carrier gas.

6. The vapor phase epitaxy apparatus of a group III nitride semiconductor according to claim 1, wherein the nitride semiconductor comprises a compound of one kind or two or more kinds of metals selected from gallium, indium, and aluminum, and nitrogen.

7. The vapor phase epitaxy apparatus of a group III nitride semiconductor according to claim 1, wherein the substrate is held with its crystal growth surface directed downward.

* * * * *